United States Patent
Christensen

(10) Patent No.: US 7,212,071 B2
(45) Date of Patent: May 1, 2007

(54) TECHNIQUES TO LOWER DRIVE IMPEDANCE AND PROVIDE REDUCED DC OFFSET

(75) Inventor: Kenn Christensen, Roskilde (DK)

(73) Assignee: Intel Corporation, Santa Clara, CA (US)

( * ) Notice: Subject to any disclaimer, the term of this patent is extended or adjusted under 35 U.S.C. 154(b) by 397 days.

(21) Appl. No.: 10/693,109

(22) Filed: Oct. 24, 2003

(65) Prior Publication Data

US 2005/0088232 A1  Apr. 28, 2005

(51) Int. Cl.
*H03F 3/45* (2006.01)
(52) U.S. Cl. .................. 330/252; 330/258; 330/302
(58) Field of Classification Search ............. 330/252, 330/258, 302
See application file for complete search history.

(56) References Cited

U.S. PATENT DOCUMENTS

| | | | |
|---|---|---|---|
| 3,991,380 A * | 11/1976 | Pryor | ............... 330/253 |
| 5,821,812 A | 10/1998 | Park et al. | |
| 6,141,169 A * | 10/2000 | Pietruszynski et al. | ....... 360/67 |
| 6,377,085 B1 * | 4/2002 | Giuroiu | ............... 327/66 |
| 6,462,618 B2 * | 10/2002 | Minegishi | ............... 330/252 |
| 2003/0107437 A1 | 6/2003 | Islam et al. | |

FOREIGN PATENT DOCUMENTS

| | | |
|---|---|---|
| EP | 1 246 367 A2 | 10/2002 |
| EP | 1 265 149 A2 | 12/2002 |

OTHER PUBLICATIONS

Wu, Jieh-Tsomg et al., *1.2V CMOS Switched-Capacitor Circuits*, IEEE International Solid-State Circuits Conference, New York, NY, Feb. 1, 1996, pp. 388-389, 479.

* cited by examiner

*Primary Examiner*—Patricia Nguyen
(74) *Attorney, Agent, or Firm*—Caven & Aghevli LLC

(57) ABSTRACT

Briefly, techniques to couple differential amplifiers with a low RC time constant and provide minimal common mode voltage reduction.

20 Claims, 5 Drawing Sheets

TECHNIQUES TO LOWER DRIVE IMPEDANCE AND PROVIDE REDUCED DC OFFSET

FIELD

The subject matter disclosed herein generally relates to techniques to couple differential amplifiers.

DESCRIPTION OF RELATED ART

FIG. 1 depicts a prior art two stage differential amplifier. The RC time constant of this two stage differential amplifier is based on the resistances of RL12 and RL13 as well as the input capacitances of transistors Q12 and Q15. The RC time constant limits the maximum speed of the prior art two stage differential amplifier. To lower this time constant, a well known emitter follower (not depicted) may be added to couple the differential amplifiers. However, by doing so the voltage across current source I7 is lowered (e.g., by Vbe volts) and thereby may lower the voltage across current source I7 to the point of not operating (e.g., lower the voltage at the emitter terminals of transistors Q12 and Q15 below a threshold operating voltage).

BRIEF DESCRIPTION OF THE DRAWINGS

Note that use of the same reference numbers in different figures indicates the same or like elements.

DETAILED DESCRIPTION

Figure 2:
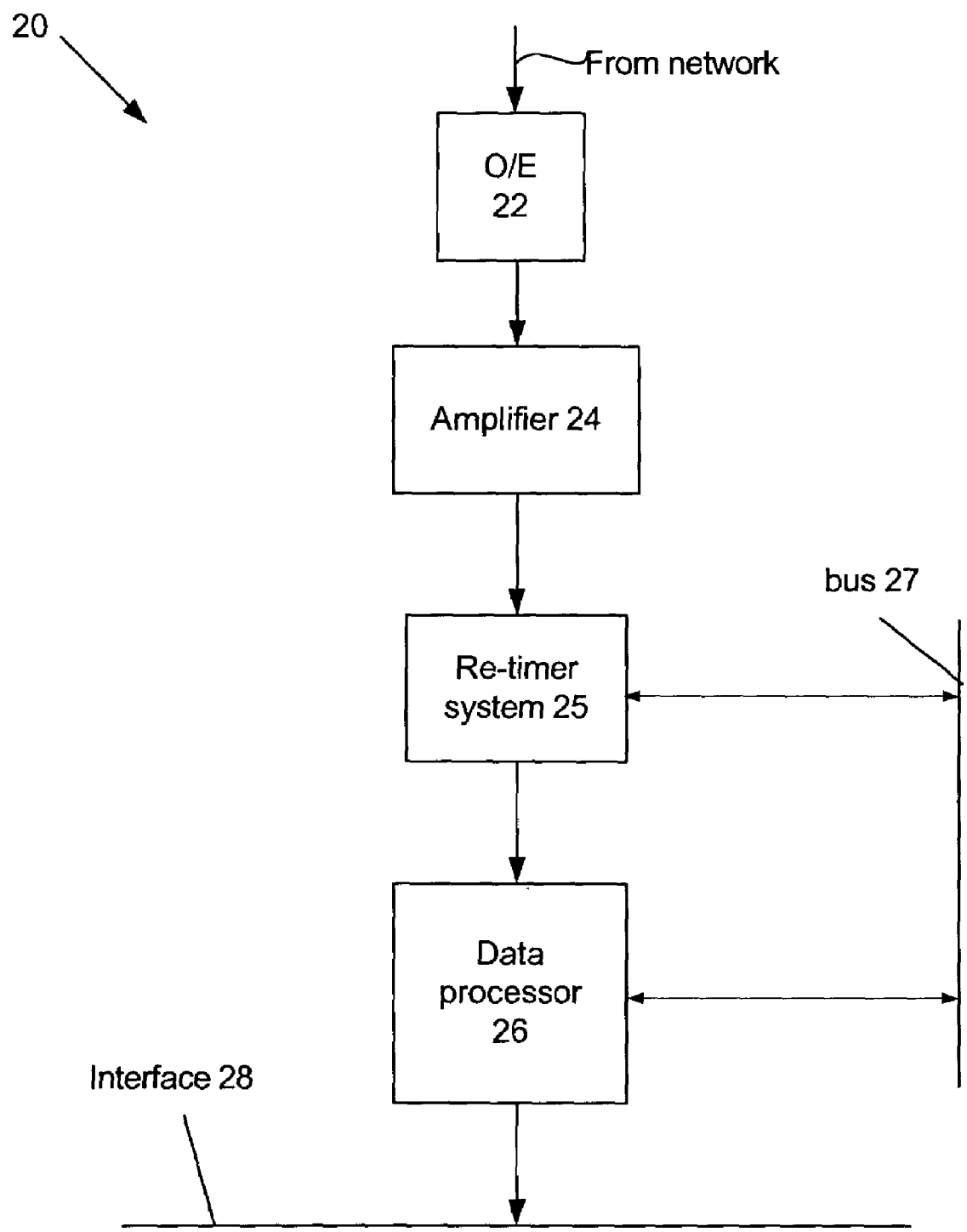
FIG. 2 depicts a receiver system in accordance with an embodiment of the present invention.

FIG. 2 depicts a receiver system 20 in accordance with an embodiment of the present invention. Receiver system 20 may include optical-to-electrical converter (O/E) 22, amplifier 24, re-timer system 25, data processor 26, bus 27, and interface 28.

O/E 22 may convert optical signals to electrical format. In some embodiments of receiver system 20, O/E 22 may not be used and electrical format signals are received by amplifier 24. Amplifier 24 may amplify an electrical format input signal. For example, amplifier 24 may receive a small input current and convert such current to a small output voltage (e.g., in the order of millivolts). Amplifier 24 may use some embodiments of the present invention. Re-timer system 25 may reduce jitter in the amplified electrical signals.

Data processor 26 may perform optical transport network (OTN) de-framing and de-wrapping in compliance for example with ITU-T G.709; and/or forward error correction (FEC) processing in compliance for example with ITU-T G.975; and/or media access control (MAC) processing in compliance for example with Ethernet.

Bus 27 may provide intercommunication between re-timer system 25 and/or data processor 26 and other devices such as a memory device (not depicted) and/or microprocessor (not depicted). Bus 27 may comply with one or more of the following standards: Ten Gigabit Attachment Unit Interface (XAUI) (described in IEEE 802.3, IEEE 802.3ae, and related standards), Serial Peripheral Interface (SPI), I²C, universal serial bus (USB), IEEE 1394, Gigabit Media Independent Interface (GMII) (described in IEEE 802.3, IEEE 802.3ae, and related standards), Peripheral Component Interconnect (PCI), ten bit interface (TBI), and/or a vendor specific multi-source agreement (MSA) protocol.

Interface 28 may provide intercommunication between data processor 26 and other devices such as a packet processor (not depicted) and/or a switch fabric (not depicted). Interface 28 may comply with similar communications standards as that of bus 27.

In one implementation, components of system 20 may be implemented as any or a combination of: hardwired logic, software stored by a memory device and executed by a microprocessor, firmware, an application specific integrated circuit (ASIC), and/or a field programmable gate array (FPGA). In one implementation, components of system 20 may be implemented among the same integrated circuit. In another implementation, components of system 20 may be implemented among several integrated circuits that intercommunicate using, for example, a bus or conductive leads of a printed circuit board.

Figure 3:
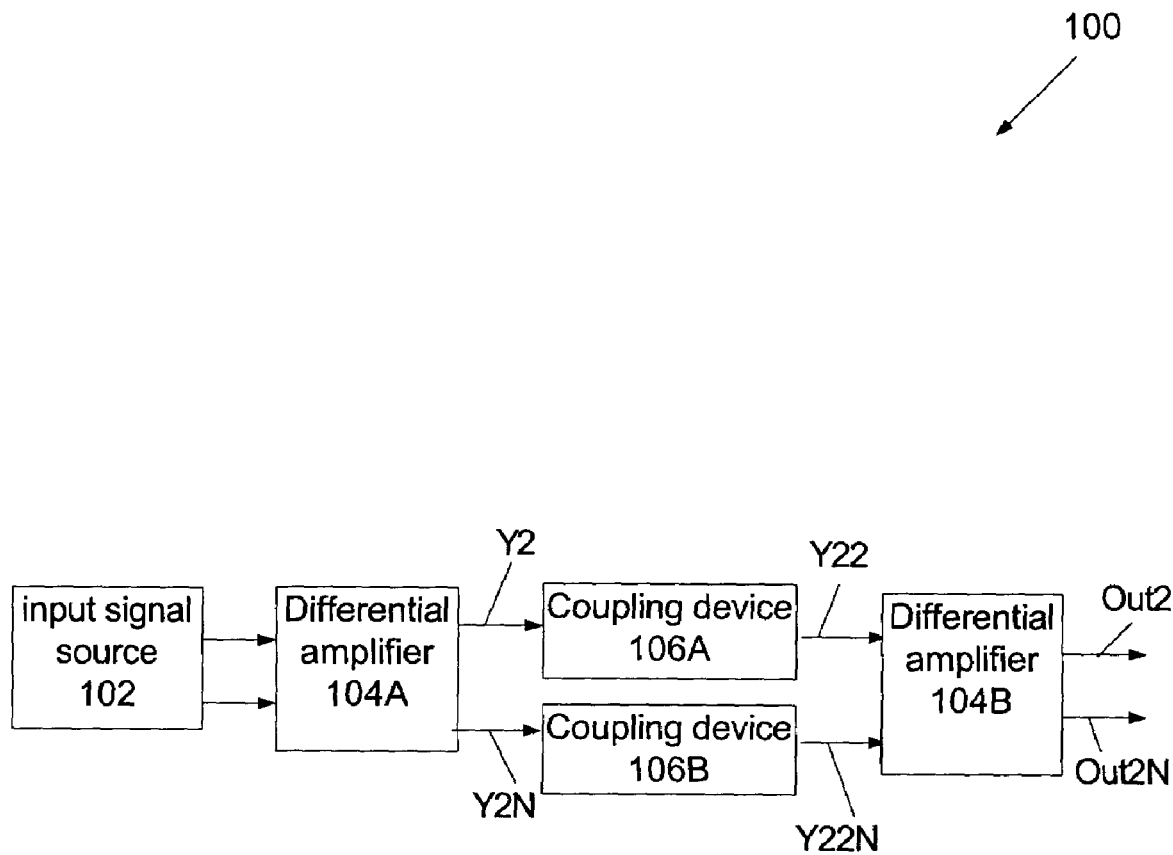
FIG. 3 depicts an amplifier in accordance with an embodiment of the present invention.

FIG. 3 depicts an amplifier 100 in accordance with an embodiment of the present invention. One implementation of amplifier 100 may include input signal source 102, differential amplifier 104A, differential amplifier 104B, coupling device 106A, and coupling device 106B. In one implementation, differential amplifiers 104A and 104B have similar characteristics and may be implemented in a similar manner. In one implementation, coupling devices 106A and 106B may have similar characteristics and may be implemented in a similar manner.

Terminal Y2 of differential amplifier 104A may provide an input to coupling device 106A whereas terminal Y2N of differential amplifier 104A may provide an input to coupling device 106B. Outputs of coupling devices 106A and 106B may be coupled to respective differential inputs Y22 and Y22N of differential amplifier 104B. Differential amplifier 104B may provide a differential output to terminals Out2 and Out2N.

Figure 4:
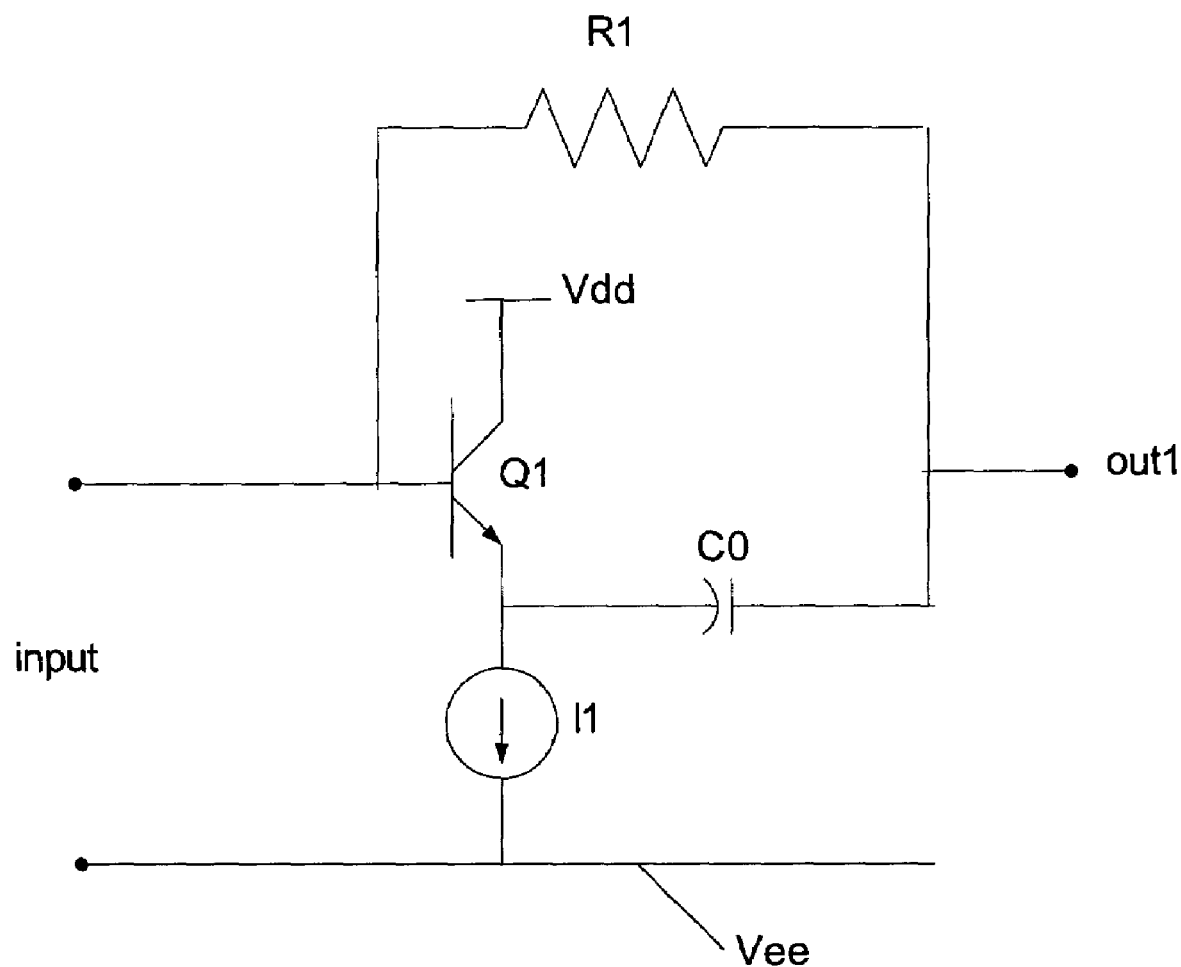
FIG. 4 depicts an implementation of a coupling device in accordance with an embodiment of the present invention.

FIG. 4 depicts one possible implementation of each of coupling devices 106A and 106B in accordance with an embodiment of the present invention. This implementation may include transistor Q1, current source I1, capacitance element C0, and resistive element R1. Transistor Q1 may be implemented as a bipolar junction transistor (BJT). A collector terminal of transistor Q1 may be coupled to a voltage source Vdd. A base terminal of transistor Q1 may be coupled to receive an input signal. An emitter terminal of transistor Q1 may be coupled to current source I1. Current source I1 may be coupled between an emitter terminal of transistor Q1 and voltage terminal Vee. Capacitance element C0 and resistive element R1 may couple respective emitter and base terminals of transistor Q1 to an output terminal.

Figure 5:
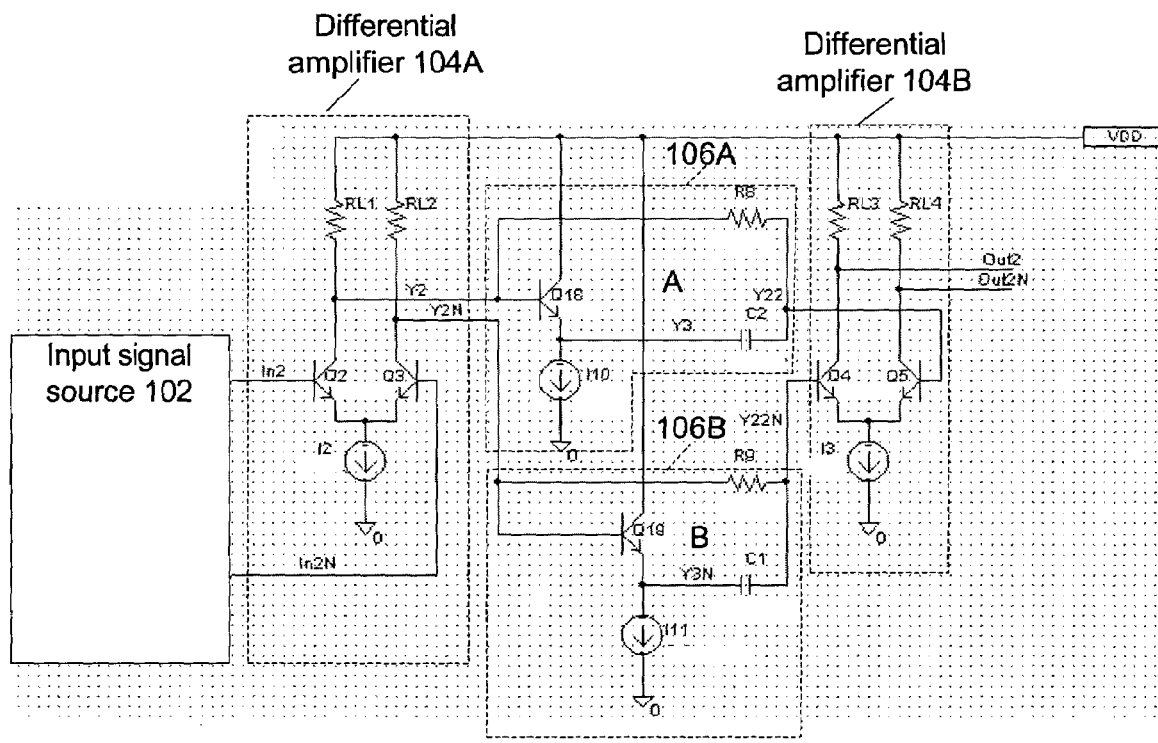
FIG. 5 depicts an implementation of an amplifier in accordance with an embodiment of the present invention.

FIG. 5 depicts an implementation of an amplifier in accordance with an embodiment of the present invention. The amplifier of FIG. 5 may include input signal source 102, differential amplifier 104A, differential amplifier 104B, coupling device 106A, and coupling device 106B. Input signal source 102 may provide an input signal to differential amplifier 104A.

One implementation of differential amplifier 104A may include transistors Q2 and Q3, current source I2, resistive element RL1, and resistive element RL2. Input signal source 102 may provide a differential input signal to terminals In2 and In2N of respective transistors Q2 and Q3. Transistors Q2 and Q3 may be implemented as bipolar junction transistors (BJT) having similar characteristics, although other transistors may be used. Collector terminals of transistors Q2 and Q3 may provide respective output terminals Y2 and Y2N. Resistive elements RL1 and RL2 may couple collector terminals of transistors Q2 and Q3 to a DC voltage source, Vdd. A common mode voltage for the input signal provided to base terminals of transistors Q2 and Q3 may be the same as that at respective output terminals Y2 and Y2N. Emitter terminals of transistors Q2 and Q3 may be coupled to current source I2. Terminal Y2 of differential amplifier 104A may provide an input to coupling device 106A whereas terminal Y2N of differential amplifier 104A may provide an input to coupling device 106B.

Coupling devices 106A and 106B may couple nodes Y2 and Y2N of differential amplifier 104A to respective differential inputs Y22 and Y22N of differential amplifier 104B. Coupling devices 106A and 106B may be implemented as devices with similar characteristics. For example, coupling devices 106A and 106B may be implemented in a similar manner to the implementation shown in FIG. 4. However, one implementation of coupling device 106A may include transistor Q18, current source I10, resistive element R8, and capacitive element C2. One implementation of coupling device 106B may include transistor Q19, current source I11, resistive element R9, and capacitive element C1.

Resistive element R8 of coupling device 106A may transfer low frequency components of signals from node Y2 to node Y22. Resistive element R9 of coupling device 106B may transfer low frequency components of signals from node Y2N to node Y22N. Capacitance element C2 may transfer high frequency components of signals from node Y2 to node Y22. Capacitance element C1 may transfer high frequency components of signals from node Y2N to node Y22N. In one implementation, common mode voltages at Y2 and Y2N may match those at nodes Y22 and Y22N.

Figure 1:
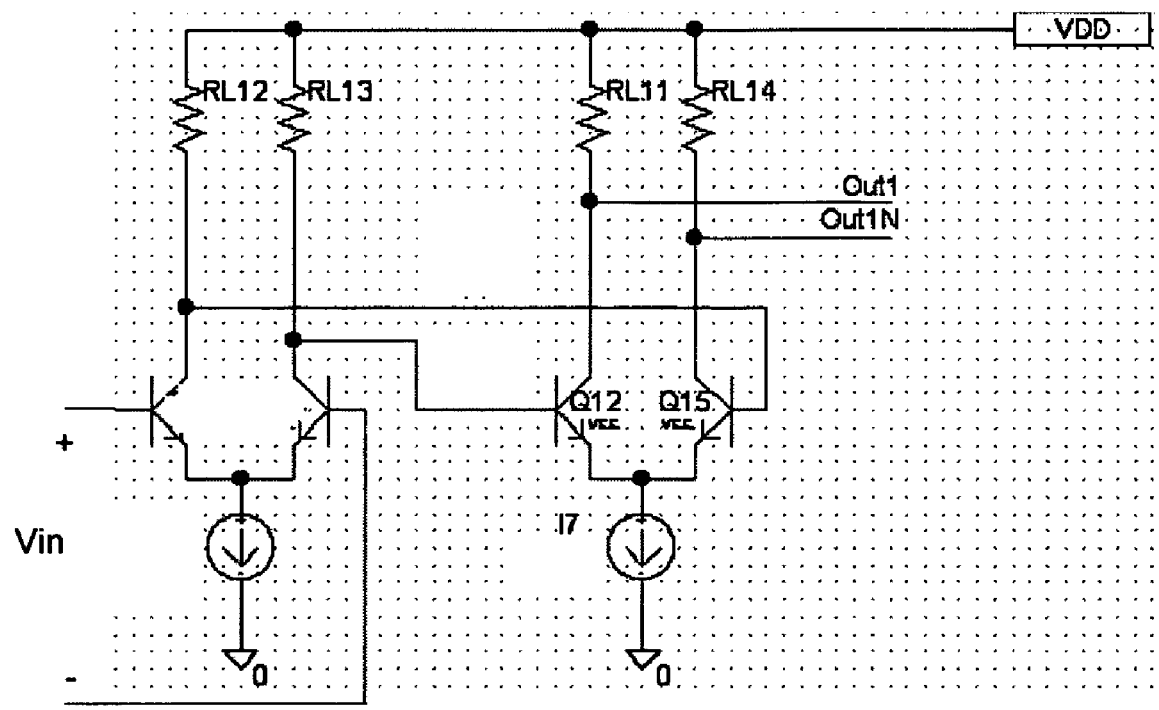
FIG. 1 depicts a prior art two stage amplifier.

One advantage of this implementation, but not a necessary feature, is that the RC time constant at output terminals of differential amplifier 104A may be lower than at the base terminals of Q12 and Q15 of the prior art two stage differential amplifier of FIG. 1. One advantage of this implementation, but not a necessary feature, is that the switching speed of nodes Y22 and Y22N may be faster than those of respective Q12 and Q15 of the prior art two stage differential amplifier of FIG. 1.

Differential amplifier 104B may be implemented in a similar manner as differential amplifier 104A. For example, one implementation of differential amplifier 104B may include transistors Q4 and Q5, current source I3, resistive element RL3, and resistive element RL4. Input node Y22 may be provided to a base terminal of transistor Q5 whereas input node Y22N may be provided to a base terminal of transistor Q4. Collector terminals of transistors Q4 and Q5 may provide respective output terminals Out2 and Out2N. Resistive elements RL3 and RL4 may couple collector terminals of transistors Q4 and Q5 to a DC voltage source, Vdd. Emitter terminals of transistors Q4 and Q5 may be coupled to current source I3.

The following parameters are merely examples and in no way limit the scope of the invention. In one implementation, resistive elements RL1, RL2, RL3, and RL4 may each have resistance values of 250 ohms. In one implementation, resistive elements R8 and R9 may each have resistance values of 1,000 ohms. In one implementation, capacitance elements C1 and C2 each may have capacitance values of 300 femtofarads. In one implementation, transistors Q2, Q3, Q4, and Q5 may have similar transistor characteristics. In one implementation, transistors Q18 and Q19 may have similar transistor characteristics. In one implementation, current sources I10 and I11 may each provide a current of 0.5 mA. In one implementation, current sources I2 and I3 may each provide a current of 1 mA. In one implementation, Vdd may have a value of 1.8 volts.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An apparatus comprising:
   a first amplifier comprising first input terminals and first output terminals, wherein the first amplifier is to amplify an input signal provided to the first input terminals and to provide the amplified input signal to the first output terminals;
   a second amplifier comprising second input terminals and second output terminals, wherein the second input terminals are operatively responsive to a second input signal and wherein the second amplifier is to amplify the second input signal and provide the amplified second input signal to the second output terminals; and
   a coupling device to provide operative responsiveness by the second input terminals to the first output terminals, wherein a common mode voltage at the first output terminals and the second input terminals are approximately equal, wherein the coupling device comprises a high frequency signal path and a low frequency signal path.

2. The apparatus of claim 1, wherein the first amplifier comprises a differential amplifier.

3. The apparatus of claim 1, wherein the second amplifier comprises a differential amplifier.

4. The apparatus of claim 1, wherein the coupling device comprises:
   a transistor device comprising first, second, and third terminals; a resistive element operatively responsive to the second terminal and wherein the second terminal is operatively responsive to at least one of the first output terminals;
   a capacitive element operatively responsive to the third terminal and wherein at least one of the second input terminals is operatively responsive to the resistive element and the capacitive element; and
   a current source operatively responsive to the capacitive element and the third terminal.

5. The apparatus of claim 1, wherein the coupling device comprises two coupling devices to couple the first output terminals to the second input terminals, and wherein each coupling device comprises:
   a transistor device comprising first, second, and third terminals;
   a resistive element operatively responsive to the second terminal and wherein the second terminal is operatively responsive to one of the first output terminals;
   a capacitive element operatively responsive to the third terminal and wherein one of the second input terminals is operatively responsive to the resistive element and the capacitive element; and
   a current source operatively responsive to the capacitive element and the third terminal.

6. The apparatus of claim 1, wherein a common mode voltage at the first input terminals and the first output terminals is approximately equal.

7. A system comprising:
an amplifier comprising:
a first amplifier comprising first input terminals and first output terminals, wherein the first amplifier is to amplify an input signal provided to the first input terminals and to provide the amplified input signal to the first output terminals,
a second amplifier comprising second input terminals and second output terminals, wherein the second input terminals are operatively responsive to a second input signal and wherein the second amplifier is to amplify the second input signal and provide the amplified second input signal to the second output terminals, and
a coupling device to provide operative responsiveness by the second input terminals to the first output terminals, wherein a common mode voltage at the first output terminals and the second input terminals are approximately equal, wherein the coupling device comprises an alternating current path and a direct current path;
a retimer system to provide samples of an output signal provided by the amplifier;
a bus communicatively coupled with the retimer system.

8. The system of claim 7, further comprising a memory device operatively responsive to the bus.

9. The system of claim A further comprising a data processor to receive samples from the retimer system.

10. The system of claim 9, wherein the data processor is to perform media access control in compliance with IEEE 802.3.

11. The system of claim 9, wherein the data processor is to perform optical transport network de-framing in compliance with ITU-T G.709.

12. The system of claim 9, wherein the data processor is to perform forward error correction processing in compliance with ITU-T G.975.

13. The system of claim 9, further comprising an interface communicatively coupled to the data processor.

14. The system of claim 13, wherein the interface is compatible with XAUI.

15. The system of claim 13, wherein the interface is compatible with IEEE 1394.

16. The system of claim 13, wherein the interface is compatible with PCI.

17. The system of claim 13, further comprising a switch fabric operatively responsive to the interface.

18. The system of claim 13, further comprising a packet processor operatively responsive to the interface.

19. An apparatus comprising:
a first amplifier comprising first input terminals and first output terminals, wherein the first amplifier is to amplify an input signal provided to the first input terminals and to provide the amplified input signal to the first output terminals;
a second amplifier comprising second input terminals and second output terminals, wherein the second input terminals are operatively responsive to a second input signal and wherein the second amplifier is to amplify the second input signal and provide the amplified second input signal to the second output terminals; and
a coupling device to provide operative responsiveness by the second input terminals to the first output terminals, wherein the coupling device comprises at least one emitter follower and wherein the coupling device comprises a high frequency signal path and a low frequency signal path.

20. The apparatus of claim 19, wherein the coupling device comprises:
a transistor device comprising first, second, and third terminals;
a resistive element operatively responsive to the second terminal and wherein the second terminal is operatively responsive to at least one of the first output terminals;
a capacitive element operatively responsive to the third terminal and wherein at least one of the second input terminals is operatively responsive to the resistive element and the capacitive element; and
a current source operatively responsive to the capacitive element and the third terminal.

* * * * *

UNITED STATES PATENT AND TRADEMARK OFFICE
CERTIFICATE OF CORRECTION

| | | |
|---|---|---|
| PATENT NO. | : 7,212,071 B2 | Page 1 of 1 |
| APPLICATION NO. | : 10/693109 | |
| DATED | : May 1, 2007 | |
| INVENTOR(S) | : Christensen | |

It is certified that error appears in the above-identified patent and that said Letters Patent is hereby corrected as shown below:

In column 5, line 30, in Claim 9, delete "claim A" and insert -- claim 7, --, therefor.

Signed and Sealed this

Tenth Day of July, 2007

JON W. DUDAS
*Director of the United States Patent and Trademark Office*